US012615894B2

(12) United States Patent
Johnson et al.

(10) Patent No.: US 12,615,894 B2
(45) Date of Patent: Apr. 28, 2026

(54) DISPLAY WITH LIGHT SOURCES AND QUANTUM DOTS

(71) Applicant: Apple Inc., Cupertino, CA (US)

(72) Inventors: Joy M Johnson, San Francisco, CA (US); Hairong Tang, Los Gatos, CA (US); Ileana-Georgeta Rau, Cupertino, CA (US); Jaein Choi, Sunnyvale, CA (US); Steven E Molesa, San Jose, CA (US); Sunggu Kang, San Jose, CA (US); Xia Li, San Jose, CA (US); Young Cheol Yang, Sunnyvale, CA (US); Young Seok Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 417 days.

(21) Appl. No.: 18/477,445

(22) Filed: Sep. 28, 2023

(65) Prior Publication Data

US 2024/0170619 A1     May 23, 2024

Related U.S. Application Data

(60) Provisional application No. 63/427,110, filed on Nov. 22, 2022.

(51) Int. Cl.
*H10H 20/851*     (2025.01)
*H10H 20/856*     (2025.01)
*H10W 90/00*     (2026.01)

(52) U.S. Cl.
CPC ...... *H10H 20/8512* (2025.01); *H10H 20/856* (2025.01); *H10W 90/00* (2026.01)

(58) Field of Classification Search
CPC .. H10H 20/8512; H10H 20/856; H10W 90/00
See application file for complete search history.

(56) References Cited

U.S. PATENT DOCUMENTS

| | | | |
|---|---|---|---|
| 8,947,619 | B2 | 2/2015 | Li et al. |
| 2018/0190625 | A1 | 7/2018 | Steckel et al. |
| 2020/0135811 | A1 | 4/2020 | Jung et al. |
| 2020/0200362 | A1 | 6/2020 | Miller et al. |
| 2020/0343230 | A1 | 10/2020 | Sizov et al. |
| 2020/0411489 | A1 | 12/2020 | Ahmed et al. |

(Continued)

FOREIGN PATENT DOCUMENTS

| | | |
|---|---|---|
| JP | 2022037718 A | 3/2022 |
| KR | 20220149889 A | 11/2022 |

*Primary Examiner* — Anne M Hines
(74) *Attorney, Agent, or Firm* — Treyz Law Group, P.C.; Joseph F. Guihan

(57)     ABSTRACT

An electronic device may have a display with an array of pixels. Each pixel may include inorganic light-emitting diodes of the same color such as a blue inorganic light-emitting diode. To emit different colors of light using the same type of inorganic light-emitting diodes, quantum dot layers may be used. Each quantum dot layer may have an associated reflective layer. Each light-emitting diode may also have an associated reflective layer. The reflective layer for the light-emitting diode may conform to the light-emitting diode or may be separated from the light-emitting diode by gap. When the reflective layer is separated from the light-emitting by a gap, the gap may be filled by a quantum dot layer or a diffusive layer.

20 Claims, 13 Drawing Sheets

(56)        References Cited

U.S. PATENT DOCUMENTS

| | | | |
|---|---|---|---|
| 2021/0005583 A1 | 1/2021 | Iguchi et al. | |
| 2021/0095193 A1 | 4/2021 | Hyung | |
| 2021/0359157 A1* | 11/2021 | Hu | H10H 20/814 |
| 2023/0268470 A1* | 8/2023 | Kuo | H01L 25/0753 |
| | | | 257/91 |
| 2024/0268159 A1* | 8/2024 | Sun | H10H 20/858 |
| 2024/0381731 A1* | 11/2024 | Jin | G02F 1/1333 |

* cited by examiner

ELECTRONIC DEVICE ~14

CONTROL CIRCUITRY ~16

INPUT-OUTPUT DEVICES ~12

DISPLAY ~14

SENSOR(S) ~13

DISPLAY WITH LIGHT SOURCES AND QUANTUM DOTS

This application claims priority to U.S. provisional patent application No. 63/427,110, filed Nov. 22, 2022, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels or a liquid crystal display (LCD) based on liquid crystal display pixels. If care is not taken, a display may have a lower than desired resolution, contrast, or efficiency, or may suffer from other artifacts.

SUMMARY

An electronic device may include an array of pixels. The array of pixels may include first, second, and third pixels. The first pixel may include a first inorganic light-emitting diode of a first color. The second pixel may include a second inorganic light-emitting diode of the first color, a first quantum dot layer that is formed over the second inorganic light-emitting diode, wherein the first quantum dot layer converts light from the first color to a second color, and a first reflective layer that is adjacent to the first quantum dot layer. The third pixel may include a third inorganic light-emitting diode of the first color, a second quantum dot layer that is formed over the third inorganic light-emitting diode, wherein the second quantum dot layer converts light from the first color to a third color, and a second reflective layer that is adjacent to the second quantum dot layer.

An electronic device may include a pixel. The pixel may include an inorganic light-emitting diode that emits light of a first color, a quantum dot layer that is formed over the inorganic light-emitting diode, wherein the quantum dot layer converts light from the first color to a second color, an electrode that is interposed between the inorganic light-emitting diode and the quantum dot layer, a first reflective layer with sidewall portions that are adjacent to the quantum dot layer, and a second reflective layer with sidewall portions that are adjacent to the inorganic light-emitting diode.

An electronic device may include an array of pixels. The array of pixels may include a blue pixel, a red pixel, and a green pixel. The blue pixel may include a first blue inorganic light-emitting diode and a diffusive layer formed in a first trench in a layer of material, wherein the diffusive layer overlaps the first blue inorganic light-emitting diode and wherein no reflective layer is formed in the first trench. The red pixel may include a second blue inorganic light-emitting diode and a first quantum dot layer that is formed in a second trench in the layer of material, wherein the first quantum dot layer overlaps the second inorganic light-emitting diode and wherein the first quantum dot layer converts blue light to red light, and a first reflective layer in the second trench that is adjacent to the first quantum dot layer. The green pixel may include a third blue inorganic light-emitting diode, a second quantum dot layer that is formed in a third trench in the layer of material, wherein the second quantum dot layer overlaps the third inorganic light-emitting diode and wherein the second quantum dot layer converts blue light to green light, and a second reflective layer in the third trench that is adjacent to the second quantum dot layer.

DETAILED DESCRIPTION

Figure 1:
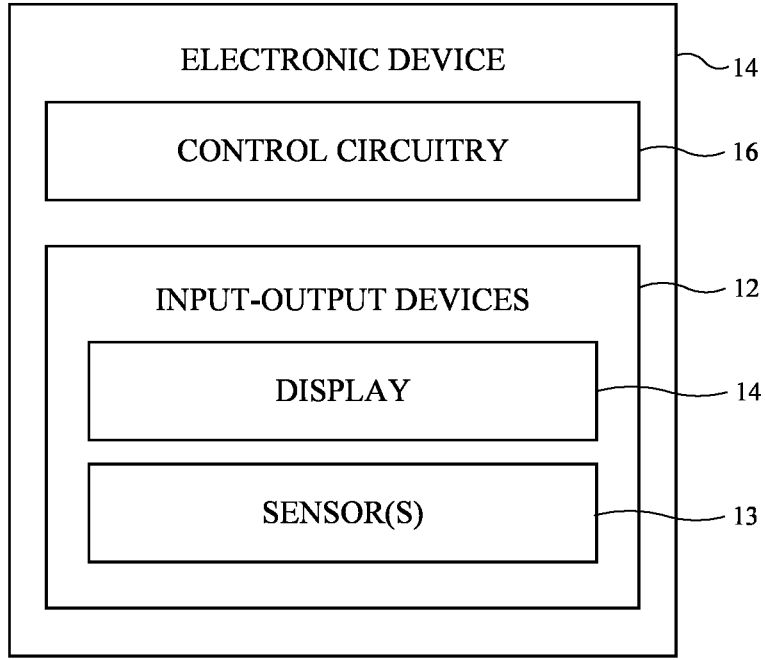
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors (cameras), fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, a display formed from an array of discrete inorganic light-emitting diodes (microLEDs) each formed from a crystalline semiconductor die, a liquid crystal display, or any other suitable type of display. Device configurations in which display 14 includes microLEDs are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
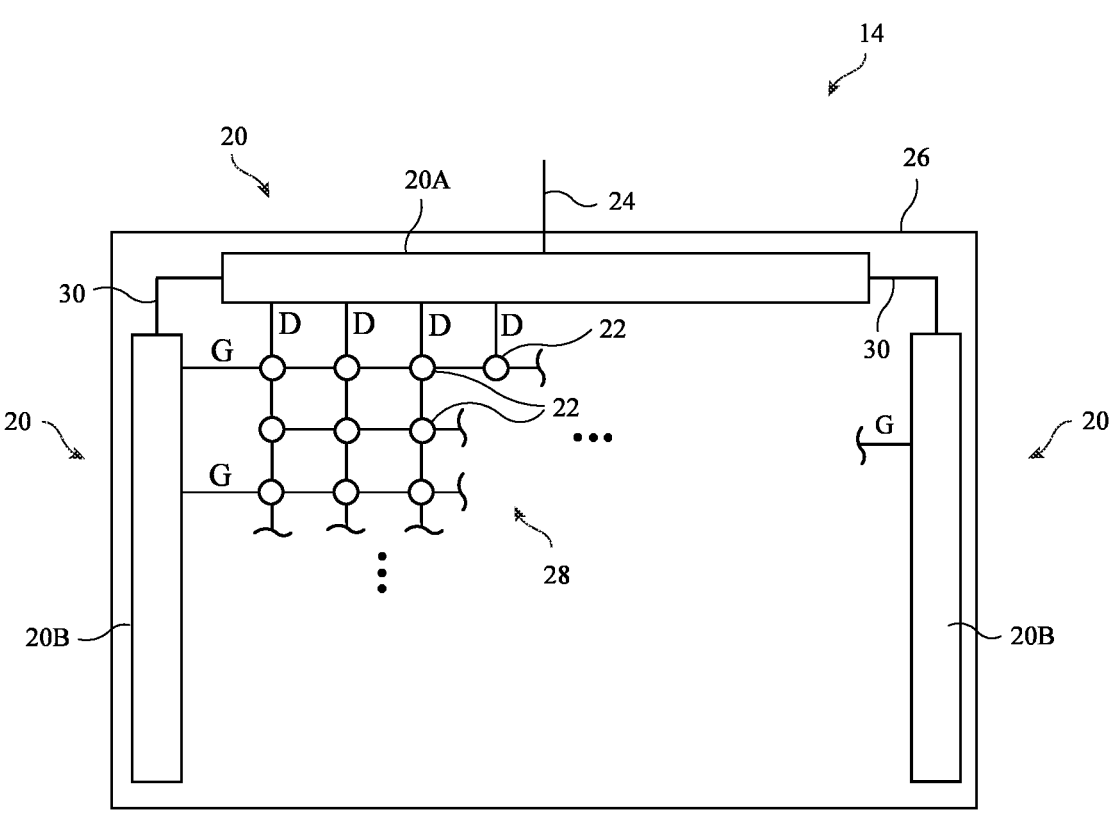
FIG. 2 is a schematic diagram of an illustrative display in accordance with some embodiments.

FIG. 2 is a diagram of an illustrative display. The display of FIG. 2 is an active matrix display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. Each pixel may include a respective microLED. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
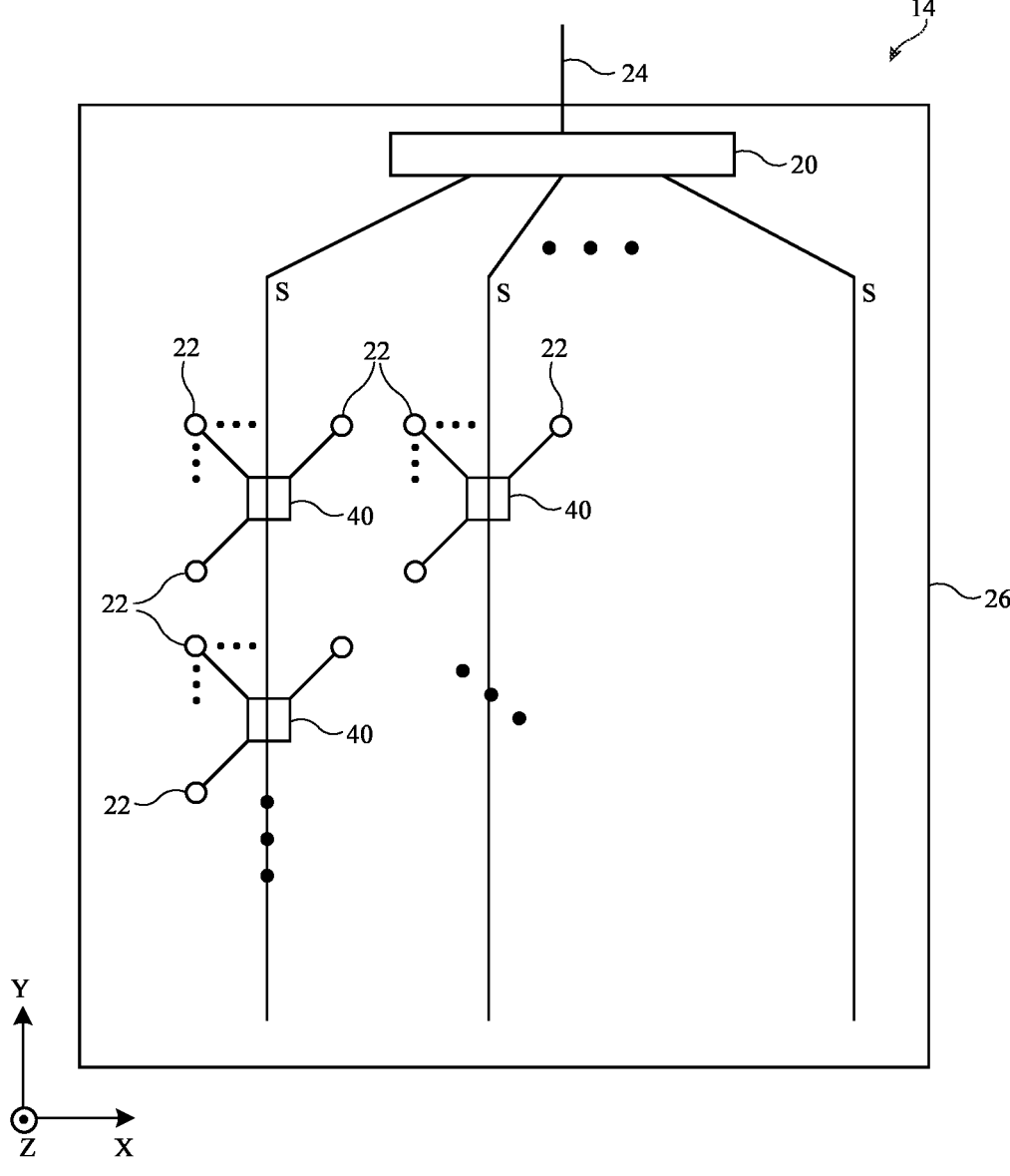
FIG. 3 is a schematic diagram of an illustrative display with pixel control circuits in accordance with some embodiments.

The active matrix addressing scheme of FIG. 2 is merely illustrative. If desired, display 14 may instead use pixel control circuits that address local passive matrices of pixels. An example of this type is shown in FIG. 3. As shown in FIG. 3, display 14 again may include layers such as substrate layer 26. Layers such as substrate 26 may be formed from layers of material such as glass layers, polymer layers, composite films that include polymer and inorganic materials, metallic foils, semiconductors such as silicon or other semiconductor materials, layers of material such as sapphire (e.g., crystalline transparent layers, ceramics, etc.), or other material. Substrate 26 may optionally be transparent (e.g., having a transparency greater than 80%, greater than 85%, greater than 90%, greater than 95%, greater than 98%, greater than 99%, etc.). Substrate 26 may be planar or may have other shapes (e.g., concave shapes, convex shapes, shapes with planar and curved surface regions, etc.). The outline of substrate 26 (e.g., when viewed from above along the Z-direction) may be circular, oval, rectangular, square, may have a combination of straight and curved edges, or may have other suitable shapes. As shown in the rectangular substrate example of FIG. 3, substrate 26 may have left and right vertical edges and upper and lower horizontal edges.

Display 14 may have an array of pixels 22 for displaying images for a user. Sets of one or more pixels 22 in FIG. 3 may be controlled using respective pixel control circuits 40 (sometimes referred to as driving circuits 40 or microdrivers 40). Pixel control circuits 40 may be formed using integrated circuits (e.g., silicon integrated circuits) and/or thin-film transistor circuitry on substrate 26. The thin-film transistor circuitry may include thin-film transistors formed from silicon (e.g., polysilicon thin-film transistors or amorphous silicon transistors) and/or may include thin-film transistors based on semiconducting oxides (e.g., indium gallium zinc oxide transistors or other semiconducting oxide thin-film transistors). Semiconducting oxide transistors such as indium gallium zinc oxide transistors may exhibit low leakage currents and may therefore be advantageous in configurations for display 14 where it is desirable to lower power consumption (e.g., by lowering the refresh rate for the pixels of the display). Configurations for display 14 in which pixel control circuits 40 are each formed from a silicon integrated circuit and a set of thin-film semiconducting oxide transistors may be used if desired.

Pixels 22 may be organized in an array (e.g., an array having rows and columns). Pixel control circuits 40 may be organized in an associated array (e.g., an array having rows and columns). As shown in FIG. 3, pixel control circuits 40 may be interspersed among the array of pixels 22. Pixels 22 and pixel control circuits 40 may be organized in arrays with rectangular outlines or may have outlines of other suitable shapes. There may be any suitable number of rows and columns in each array (e.g., ten or more, one hundred or more, or one thousand or more).

Each pixel 22 may be formed from a light-emitting component such as a light-emitting diode. If desired, each pixel may contain a pair of light-emitting diodes or other suitable number of light-emitting diodes for redundancy. In this type of configuration, the pair of light-emitting diodes in each pixel can be driven in parallel (as an example). In the event that one of the light-emitting diodes fails, the other light-emitting diode will still produce light. Alternatively or in addition, multiple pixel control circuits may be configured to control each pixel. In the event that one of the pixel control circuit fails, the other pixel control circuit will still control the pixel.

Display driver circuitry such as display driver circuitry 20 may be coupled to conductive paths such as metal traces on substrate 26 using solder or conductive adhesive. Display driver circuitry 20 may contain communications circuitry for communicating with system control circuitry over path 24. Path 24 may be formed from traces on a flexible printed circuit or other cable or may be formed using other signal path structures in device 10. The control circuitry may be located on a main logic board in an electronic device in which display 14 is being used. During operation, the control circuitry on the logic board (e.g., control circuitry 16 of FIG. 1) may supply circuitry such as display driver circuitry 20 with information on images to be displayed on display 14. To display the images on display pixels 22, display driver circuitry 20 may supply corresponding image data, control signals, and/or power supply signals to signal lines S. The signal lines provide corresponding image data, control signals, and power to the pixel control circuits 40. Based on the received power, image data, and control signals, the pixel control circuits 40 direct a respective subset of pixels 22 to generate light at desired intensity levels.

Signal lines S may carry analog and/or digital control signals (e.g., scan signals, emission transistor control signals, clock signals, digital control data, power supply signals, etc.). In some cases, a signal line may be coupled to a respective column of pixel control circuits 40. In some cases, a signal line may be coupled to a respective row of pixel control circuits 40. Each pixel control circuit 40 may be coupled to one or more signal lines. Circuitry 20 may be formed on the upper edge of display 14 (as in FIG. 3), on the lower edge of display 14, on the upper and left edges of display 14, on the upper, left, and right edges of display, or any other desired location(s) within display 14.

Display control circuitry such as circuitry 20 may be implemented using one or more integrated circuits (e.g., display driver integrated circuits such as timing controller integrated circuits and associated source driver circuits and/or gate driver circuits) or may be implemented using thin-film transistor circuitry implemented on substrate 26.

Pixels 22 may be organic light-emitting diode pixels or liquid crystal display pixels. Alternatively, pixels 22 in FIG. 3 may be formed from discrete inorganic light-emitting diodes (sometimes referred to as microLEDs). Pixels 22 may include light-emitting diodes of different colors (e.g., red, green, blue). Alternatively, each pixel may have light-emitting diodes of a single color and quantum dot layers may be used to convert the single color into other colors of light.

Signal lines may be used to carry red, green, and blue data. Pixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 22 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques. The light-emitting diodes of pixels 22 may radiate upwards (i.e., pixels 22 may use a top emission design) or may radiate downwards through substrate 26 (i.e., pixels 22 may use a bottom emission design). The light-emitting diodes may have thicknesses between 0.5 and 10 microns and may have lateral dimensions between 2 microns and 100 microns (as examples). Light-emitting diodes with other thicknesses (e.g., below 2 microns, above 2 microns, etc.) and that have other lateral dimensions (e.g., below 10 microns, below 20 microns, above 3 microns, above 15 microns, etc.) may also be used, if desired.

If desired, digital control signals can be provided to circuits 40 (over signal lines S), which may then produce corresponding analog light-emitting drive signals based on the digital control signals. During operation of display 14, each pixel control circuit 40 may supply output signals to a corresponding set of pixels 22 based on the control signals received by that pixel control circuit from display driver circuitry 20.

Figure 4:
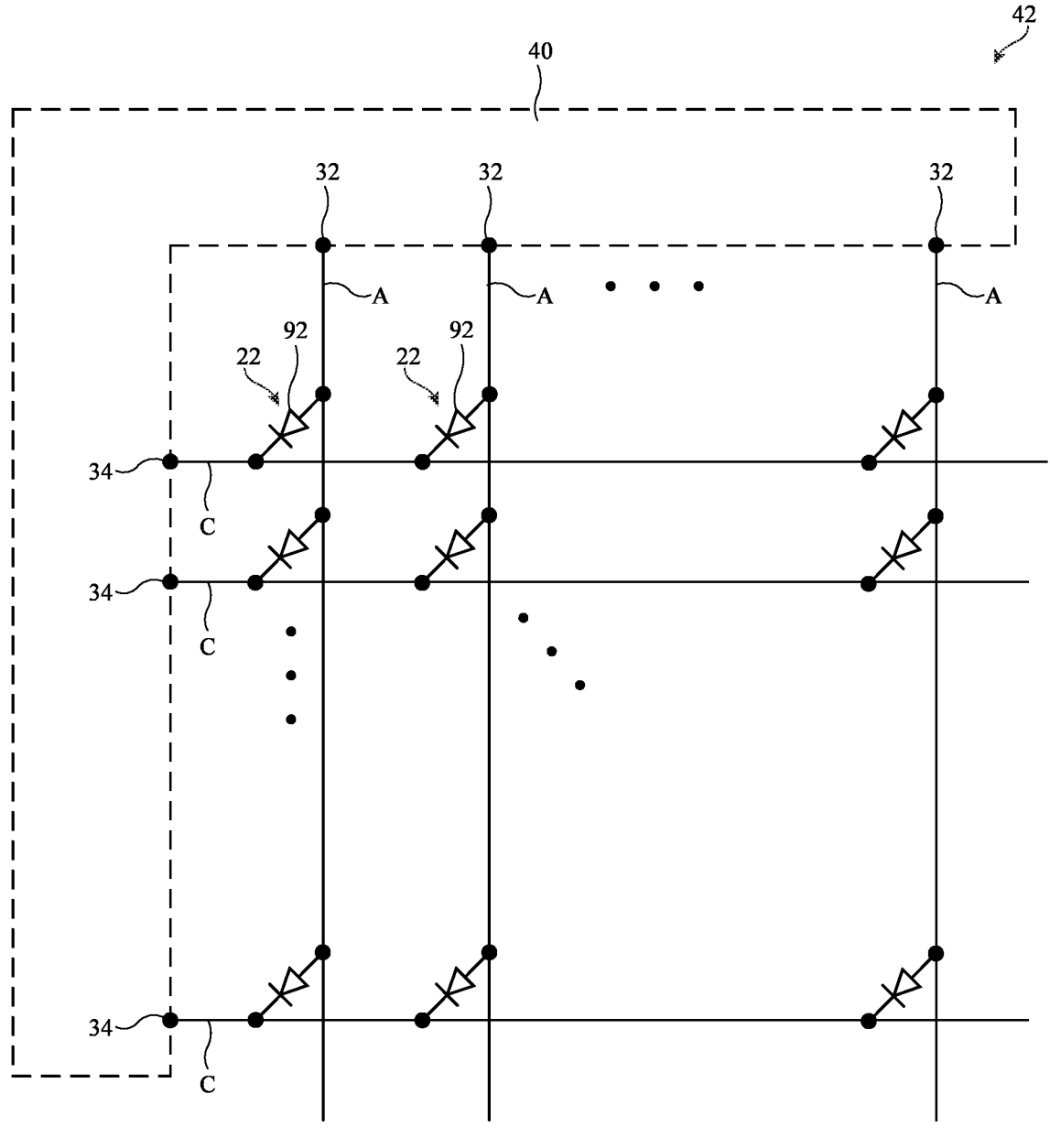
FIG. 4 is a schematic diagram of an illustrative passive matrix of light-emitting diodes that is controlled by a pixel control circuit in accordance with some embodiments.

As one example, each pixel control circuit 40 may control a respective local passive matrix 42 of LED pixels 22. FIG. 4 is a schematic diagram of a local passive matrix 42 of LED pixels 22. As shown in FIG. 4, the anode of each LED 92 is coupled to a respective anode contact line A (sometimes referred to as anode contact A or anode line A). The LEDs 92 of each column in the passive matrix are connected to a common anode contact A. The cathode of each LED 92 is coupled to a respective cathode contact line C (sometimes referred to as cathode contact C or cathode line C). The LEDs 92 of each row in the passive matrix are connected to a common cathode contact C.

Pixel control circuit 40 may control the current and voltage provided to each anode line A. The pixel control circuit 40 may also control the voltage provided to each cathode contact line C. In this way, pixel control circuit 40 controls the current through each light-emitting diode 22, which controls the intensity of light emitted by each light-emitting diode. During operation of the passive matrix, pixel control circuit 40 may scan the pixels 22 row-by-row at high speeds to cause each LED 92 to emit light at a desired brightness level. In other words, each pixel in the first row is updated to a desired brightness level, then each pixel in the second row is updated to a desired brightness level, etc.

Pixel control circuit 40 may have first output terminals 32 that are coupled to the anode contact lines A and second output terminals 34 that are coupled to the cathode contact lines C. Pixel control circuit 40 may have one output terminal 32 per anode contact line and one output terminal 34 per cathode contact line, as one example. Using the passive matrix as in FIG. 4 therefore allows pixel control circuit 40 to control 64 light-emitting diodes (e.g., in an 8×8 grid) using only 16 outputs (8 anode output terminals and 8 cathode output terminals).

Figure 5:
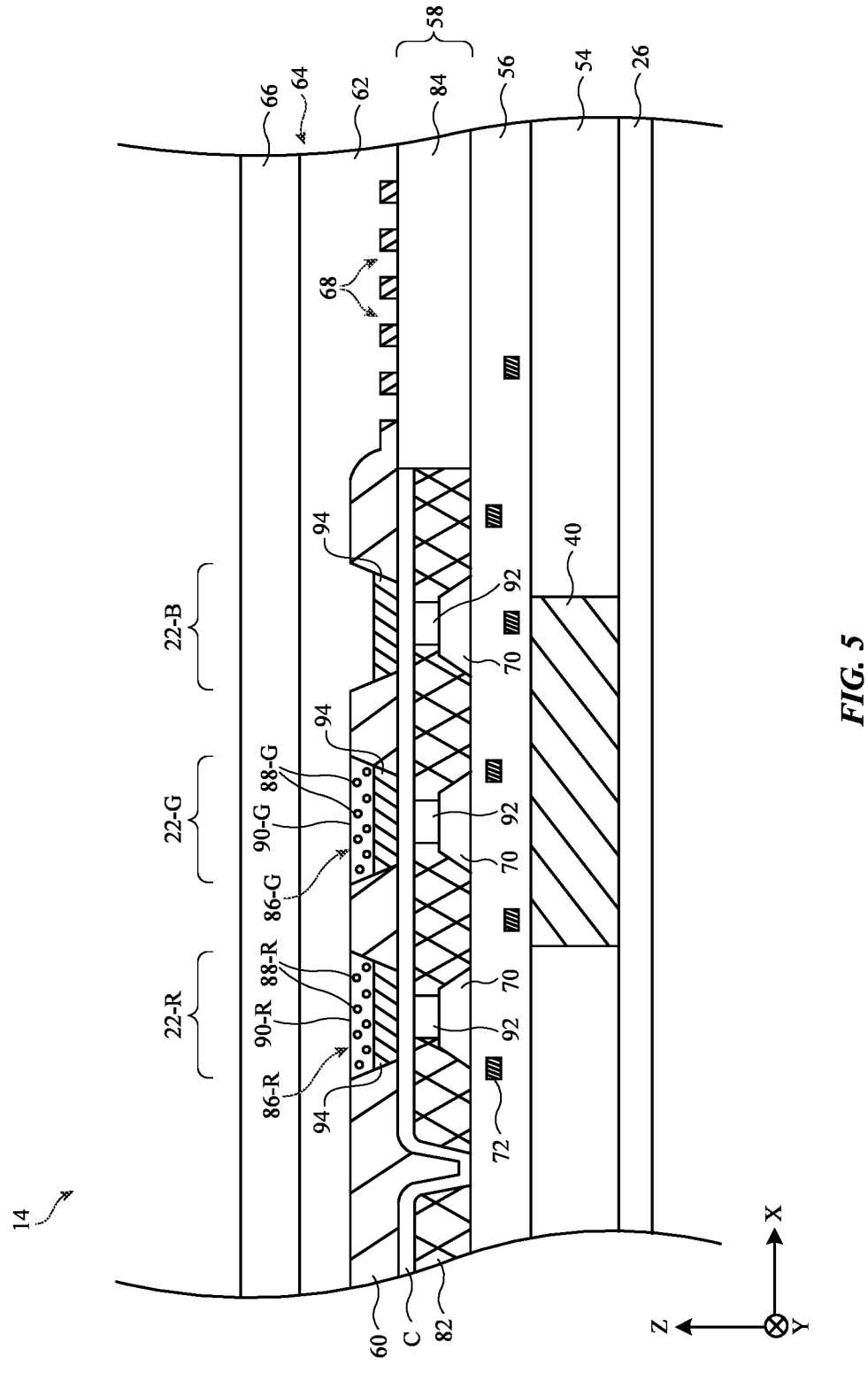
FIG. 5 is a cross-sectional side view of an illustrative display with pixels of different colors in accordance with some embodiments.

FIG. 5 is a cross-sectional side view of an illustrative display with LEDs 92 and a pixel control circuit 40 (e.g., a display with the arrangement of FIGS. 3 and 4). As shown in FIG. 5, display 14 may include a substrate 26. As previously mentioned, substrate 26 may be formed from layers of material such as glass layers, polymer layers (e.g., polyimide), composite films that include polymer and inorganic materials, metallic foils, semiconductors such as silicon or other semiconductor materials, layers of material such as sapphire, etc. In the example of FIG. 5, substrate 26 may be formed from polyimide.

Pixel control circuit 40 (sometimes referred to as micro-driver 40) is formed on substrate 26. Pixel control circuit 40 is laterally surrounded by planarization layer 54. Planarization layer 54 may be an optically clear organic resin, as one example. Planarization layer 54 may be formed from any other desired material.

One or more insulation layers 56 is formed on an upper surface of planarization layer 54. Each insulation layer 56 may be formed from the same material or different insulation layers may be formed from different materials. Layers 56 may be formed from the same material as layer 54 or a different material than layer 54. Layers 56 may be formed from an optically clear organic resin, as one example. In general, layers 56 may be formed from any desired material. Layers 56 serve as insulating layers for backplane metal layers 72. The backplane metal layers 72 may include various signal lines and conductive vias that are used to electrically route signals within display 14. The backplane metal layers may electrically connect microdriver 40 to LEDs 92, as one example.

Spacer layers 70 and LEDs 92 are formed on the upper surface of layer(s) 56. Spacers 70 may be formed from the same material as layer 56 or a different material than layer 56. Spacers 70 may be formed from the same material as layer 54 or a different material than layer 54. Spacers 70 may be formed from an optically clear organic resin, as one example. In general, spacers 70 may be formed from any desired material. The spacers serve to position LEDs 92 at a desired location (height) within the display. Each LED 92 may be attached to an upper surface of respective spacer 70 with adhesive or with a conductive structure (e.g., a conductive adhesive).

In the example of FIG. 5, LEDs 92 and spacers 70 may be laterally surrounded by an opaque masking layer 82. The opaque masking layer 82 may have an opacity that is greater than 50%, greater than 70%, greater than 90%, greater than 95%, greater than 99%, etc.

In one possible arrangement, the opaque masking layer 82 is omitted in a portion of the display (e.g., to allow ambient light to pass through the display to an underlying camera or other sensor). As shown in FIG. 5, a transparent layer 84 may be formed in this area. The transparent layer may be formed from an optically clear organic resin, for example. The transparent layer may have a transparency that is greater than 70%, greater than 90%, greater than 95%, greater than 99%, etc. Opaque masking layer 82 and transparent layer 84 may collectively be referred to as a planarization layer 58. The example of the planarization layer 58 being formed from an opaque masking layer 82 with transparent windows that include transparent layer 84 is merely illustrative. If desired, planarization layer 58 may be formed entirely from the opaque masking layer 82 or entirely from the transparent layer 84.

Transparent layer 84 may be formed from the same material as layer 54 or a different material than layer 54. Transparent layer 84 may be formed from the same material as layer 56 or a different material than layer 56. Transparent layer 84 may be formed from the same material as layer 70 or a different material than layer 70.

A conductive layer such as cathode line C may be formed on the upper surface of planarization layer 58. Cathode line C may be formed from a transparent conductive material such as indium tin oxide (ITO). Cathode line C may have a high transparency (e.g., greater than 75%, greater than 80%, greater than 85%, greater than 90%, greater than 95%, greater than 99%, etc.). Cathode line C may be electrically connected to one or more LEDs 92 on the display (as shown and discussed in connection with FIG. 4).

An additional opaque masking layer 60 may be formed over the LEDs on display 14. As shown in FIG. 5, opaque masking layer 60 is formed on an upper surface of cathode line C. The opaque masking layer has openings that are aligned with LEDs 92 (to allow light from LEDs 92 to pass through the opaque masking layer). The openings in the opaque masking layer may have angled sidewalls (e.g., at a non-zero, non-orthogonal angle relative to the XY-plane) and may sometimes be referred to as trenches. The opaque masking layer 60 may have an opacity that is greater than 50%, greater than 70%, greater than 80%, greater than 85%, greater than 90%, greater than 95%, greater than 99%, etc. Covering the backplane metals (72) with opaque masking layers 60 and/or 82 prevents ambient light from reflecting off the backplane metals towards a viewer (which would reduce display contrast).

Both opaque masking layers 82 and 60 may be formed from carbon black particles embedded in an organic resin. The density of carbon black particles within the organic resin may be selected for each opaque masking layer to control the transmission of the opaque masking layer. A higher density of carbon black particles (sometimes referred to as optical density) results in a lower transmission and higher opacity whereas a lower density of carbon black particles results in a higher transmission and lower opacity. In one illustrative arrangement, the optical density of opaque masking layer 82 may be greater than the optical density of opaque masking layer 60 (e.g., by more than 10%, by more than 20%, by more than 50%, by more than 100%, by more than 200%, etc.). The total transmission of opaque masking layer 60 may be more than 5%, more than 15%, more than 25%, more than 40%, more than 50%, more than 70%, etc. The total transmission of opaque masking layer 82 may be less than 3%, less than 5%, less than 10%, less than 25%, etc. The difference in total transmission between opaque masking layers 60 and 82 may be more than 5%, more than 15%, more than 25%, more than 40%, more than 50%, more than 70%, etc.

Reducing the optical density of opaque masking layer 60 (relative to opaque masking layer 82) allows for the index of refraction of layer 60 to be lowered relative to layer 82 (which may be advantageous for the optical performance of the display).

Opaque masking layer 60 may have openings 68 in some portions of the display to allow ambient light to pass through the display to an underlying camera or other sensor. The openings 68 may overlap the transparent window in the underlying opaque masking layer 82.

A planarization layer 62 is formed over opaque masking layer 60. Planarization layer 62 may be formed from the same material as layer 54 or a different material than layer 54. Planarization layer 62 may be formed from the same material as layer 58 or a different material than layer 58. Planarization layer 62 may be formed from the same material as layer 56 or a different material than layer 56. Planarization layer 62 may be formed from the same material as layer 70 or a different material than layer 70. Planarization layer 62 may be formed from an optically clear organic resin, as one example.

A cover layer 66 may be formed over planarization layer 62. Cover layer 66 may be formed from glass, polymer, a crystalline transparent layer such as sapphire, etc. Cover layer 66 may have a high transparency (e.g., greater than 75%, greater than 80%, greater than 85%, greater than 90%, greater than 95%, greater than 99%, etc.).

In some arrangements, display 14 may include a polarizer at location 64 between planarization layer 62 and cover layer 66. The polarizer may be a circular polarizer layer that includes a linear polarizer and a quarter wave plate. The circular polarizer may mitigate reflections of ambient light off of display 14. As a consequence of mitigating the reflections of ambient light, the polarizer also mitigates the brightness of display light emitted by pixels 22 in display 14. Therefore, to increase the efficiency of the display, the polarizer may sometimes be omitted. In this type of arrangement (e.g., shown in FIG. 5), there is no polarizer between LEDs 92 and display cover layer 66. These types of displays may be referred to as polarizer-free displays.

Layers 54, 56, 84, and 62 may each have a high transparency (e.g., greater than 75%, greater than 80%, greater than 85%, greater than 90%, greater than 95%, greater than 99%, etc.).

It may be desirable for display 14 to be capable of emitting red, blue, and green light. In other words, display 14 may include red pixels 22-R that emit red light, green pixels 22-G that emit green light, and blue pixels 22-B that emit blue light. In one possible arrangement, the red pixels may include red light-emitting diodes, the green pixels may include green light-emitting diodes, and the blue pixels may include blue light-emitting diodes. However, this type of arrangement requires developing high-reliability manufacturing processes for light-emitting diodes of three different colors.

To reduce the cost and complexity of manufacturing, red pixels 22-R, green pixels 22-G, and blue pixels 22-B may all include light-emitting diodes of a single color (e.g., blue light-emitting diodes). Quantum dot layers are included in the red and green pixels to convert the blue light from the blue light-emitting diodes to red light and green light, respectively.

In the example of FIG. 5, the light-emitting diodes 92 are all blue light-emitting diodes. In other words, the red pixels may include blue light-emitting diodes 92, the green pixels may include blue light-emitting diodes 92, and the blue pixels may include blue light-emitting diodes 92.

The red pixels 22-R include a quantum dot layer 86-R with red quantum dots 88-R distributed in a host material 90-R. The red quantum dots 88-R may convert blue light to red light. Therefore, blue light from the underlying light-emitting diode 92 will be converted to red light. Quantum dot layer 86-R is formed in an opening in opaque masking layer 60.

As shown in FIG. 5, the red pixels may also include a diffusive layer in the opening in the opaque masking layer (adjacent to the quantum dot layer 86-R). As shown, diffusive layer 94 (sometimes referred to as diffuser 94) is formed in the opaque masking layer opening between LED 92 and red quantum dot layer 86-R. Diffuser 94 may be formed by nanoparticles (sometimes referred to as diffusive nanoparticles or light scattering nanoparticles) embedded in a clear organic resin (sometimes referred to as a host material).

The green pixels 22-G include a quantum dot layer 86-G with green quantum dots 88-G distributed in a host material 90-G. The green quantum dots 88-G may convert blue light to green light. Therefore, blue light from the underlying light-emitting diode 92 will be converted to green light. Quantum dot layer 86-G is formed in an opening in opaque masking layer 60.

The green pixels may also include a portion of the diffusive layer in the opening in the opaque masking layer (adjacent to the quantum dot layer 86-G). As shown, a portion of diffusive layer 94 is formed in the opaque masking layer opening between LED 92 and green quantum dot layer 86-G.

Unlike the red and green pixels, the blue pixels have a corresponding blue light-emitting diode and therefore do not need a dedicated quantum dot layer. However, as shown in FIG. 5, the blue pixels may include a portion of diffusive layer 94 formed in an opaque masking layer opening over LED 92.

One potential cause of visible artifacts in the display is the different colored pixels having different emission profiles. Including diffusive layer 94 over the LED in each pixel may mitigate this type of variation.

In the red pixels 22-R, a blue LED 92 may emit light vertically in the positive Z-direction. The light passes through an opening in opaque masking layer 60 that includes a diffusive layer 94 and a red quantum dot layer 86-R.

In the green pixels 22-G, a green LED 92 may emit light vertically in the positive Z-direction. The light passes through an opening in opaque masking layer 60 that includes a diffusive layer 94 and a green quantum dot layer 86-G.

In the blue pixels 22-R, a blue LED 92 may emit light vertically in the positive Z-direction. The light passes through an opening in opaque masking layer 60 that includes a diffusive layer 94.

Each LED 92 in display 14 may additionally emit edge light that is parallel to the XY-plane (or closer in angle to the XY-plane than vertical). To increase the efficiency of display 14, it is desirable for the edge-emission light to be redirected towards a viewer of the display (e.g., in the positive Z-direction).

To redirect this edge-emission light, a reflective layer may be incorporated around each LED 92. FIGS. 6-13 are cross-sectional side views of illustrative pixels with reflective layers. It should be understood that any of the pixels depicted in FIGS. 6-13 may be used in the display of FIG. 5.

Figure 6:
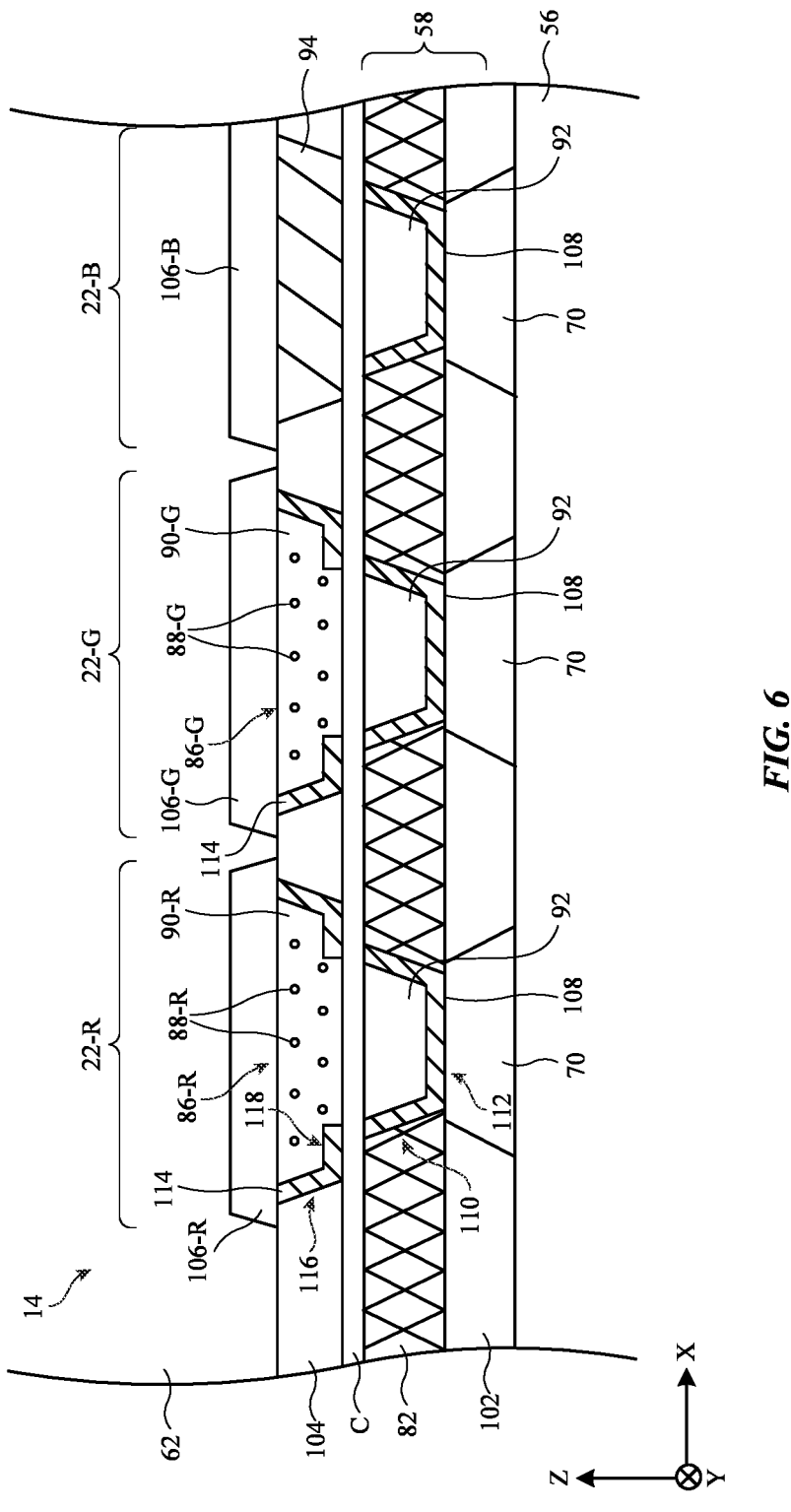
FIG. 6 is a cross-sectional side view of an illustrative display with quantum dot layers and a diffusive layer in respective trenches in accordance with some embodiments.

As shown in FIG. 6, each LED 92 has a corresponding reflector 108. Each reflector 108 has a first portion 112 (sometimes referred to as bottom portion 112) that is parallel to the XY-plane. The bottom portion 112 may help reflect back-emission light from LED 92 and light that is back-scattered from the quantum dots in the positive Z-direction, thus improving efficiency. Reflector 108 also includes sidewall portion 110. Sidewall portion 110 may be at a non-zero, non-orthogonal angle relative to the XY-plane (e.g., at an angle that is between 10 degrees and 80 degrees, between 20 degrees and 70 degrees, etc.). Sidewall portion 110 may help reflect side-emission light from LED 92 in the positive Z-direction, thus improving efficiency.

Further efficiency improvements may be obtained by using a reflector 114 in the trench that includes the quantum dot layers. In the example of FIG. 6, a planarization layer 104 is formed over cathode C. The planarization layer 104 may be a transparent planarization layer or an opaque masking layer (as with opaque masking layer 60 in FIG. 5). The red pixel 22-R has an opening (sometimes referred to as a trench) in the planarization layer that contains a red quantum dot layer 86-R. In this example, only the red quantum dot layer 86-R is included in the opening (and not an additional diffusive layer as in FIG. 5). The green pixel 22-G has an opening in the planarization layer that contains a green quantum dot layer 86-G. In this example, only the green quantum dot layer 86-G is included in the opening (and not an additional diffusive layer as in FIG. 5). The blue pixel 22-B has an opening in the planarization layer that contains a diffusive layer 94. In FIG. 6, quantum dot layer 86-R, quantum dot layer 86-G, and diffusive layer 94 fill their respective trenches such that there is a coplanar surface defined partially by planarization layer 94 and partially by quantum dot layer 86-R, quantum dot layer 86-G, and diffusive layer 94. In other words, quantum dot layer 86-R, quantum dot layer 86-G, and diffusive layer 94 do not extend past an upper surface of planarization layer 94 in the positive Z-direction.

A reflector 114 is formed in the trench that includes the red quantum dot layer 86-R. Reflector 114 has a first portion 118 (sometimes referred to as bottom portion 118) that is parallel to the XY-plane. The bottom portion has an opening to allow light from LED 92 to pass through in the positive Z-direction. Bottom portion 118 may help reflect light that is back-scattered from quantum dots 88-R during conversion in the positive Z-direction, thus improving efficiency. Reflector 114 also includes sidewall portion 116. Sidewall portion 116 may be at a non-zero, non-orthogonal angle relative to the XY-plane (e.g., at an angle that is between 10 degrees and 80 degrees, between 20 degrees and 70 degrees, etc.). Sidewall portion 116 may help reflect light that is scattered sideways from quantum dots 88-R during conversion in the positive Z-direction, thus improving efficiency.

A reflector 114 is also formed in the trench for green pixel 22-G with the green quantum dot layer 86-G. However, there is no reflector in the trench for blue pixel 22-B with the diffusive layer 94 (because the blue pixel does not include quantum dots).

Each one of reflectors 108 and 114 may have a reflectance that is greater than 50%, greater than 75%, greater than 90%, greater than 95%, etc. Each one of reflectors 108 and 114 may be formed from any desired material.

In FIG. 6, each pixel includes a corresponding color filter. A red color filter 106-R is formed over quantum dot layer 86-R for red pixel 22-R. A green color filter 106-G is formed over quantum dot layer 86-G for green pixel 22-G. A blue color filter 106-B is formed over diffusive layer 94 for blue pixel 22-B. This example is merely illustrative and the color filters may be omitted over pixels of one or more colors if desired.

FIG. 6 also shows an example where planarization layer 58 includes an opaque masking layer 82 that is formed over a transparent planarization layer 102. The transparent planarization layer 102 has an upper surface that is coplanar with spacers 70. This example is merely illustrative. Planarization layer 58 may instead be entirely formed from an opaque masking layer (with optional transparent windows) as shown in FIG. 5.

In the example of FIG. 6, blue pixel 22-B includes a diffusive layer whereas red and green pixels 22-R and 22G do not include a diffusive layer. This example is merely illustrative. In an alternate arrangement, shown in FIG. 7, red pixel 22-R includes a diffusive layer 94 underneath the quantum dot layer 86-R and green pixel 22-G includes a diffusive layer 94 underneath the quantum dot layer 86-G (similar to as in FIG. 5).

Figure 7:
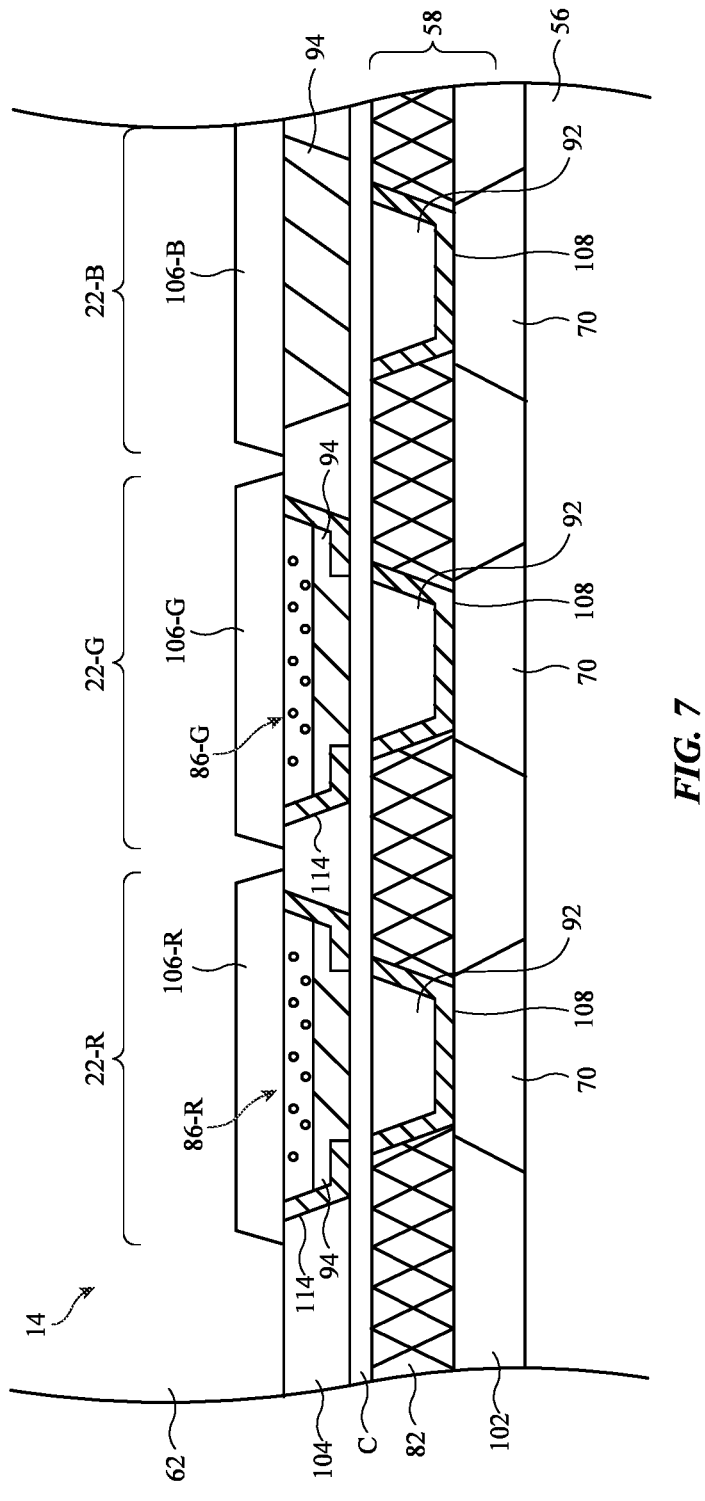
FIG. 7 is a cross-sectional side view of an illustrative display with a quantum dot layer and a diffusive layer in a single trench in accordance with some embodiments.

In FIG. 7, each pixel includes a corresponding color filter. A red color filter 106-R is formed over quantum dot layer 86-R for red pixel 22-R. A green color filter 106-G is formed over quantum dot layer 86-G for green pixel 22-G. A blue color filter 106-B is formed over diffusive layer 94 for blue pixel 22-B. This example is merely illustrative and the color filters may be omitted over pixels of one or more colors if desired.

Figure 8:
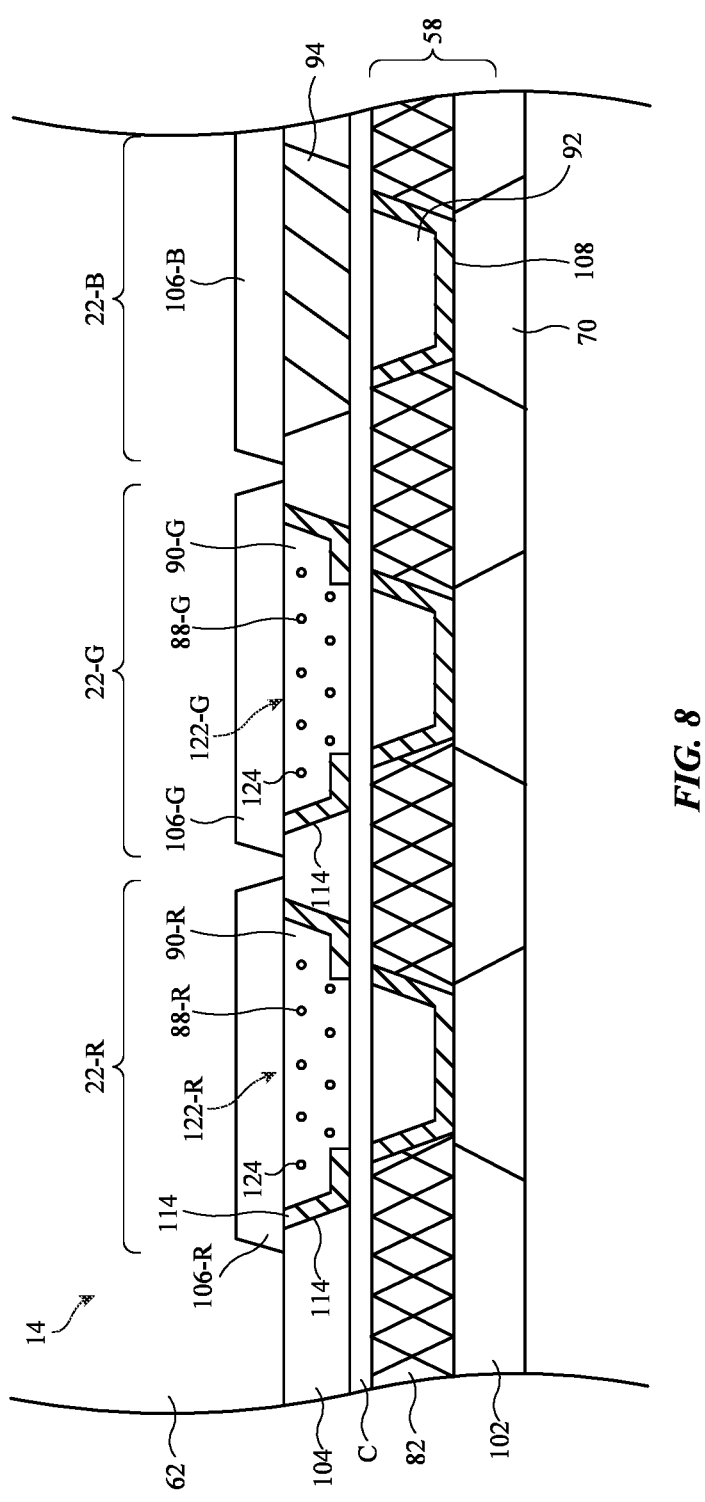
FIG. 8 is a cross-sectional side view of an illustrative display with diffusive quantum dot layers in accordance with some embodiments.

In another possible arrangement, shown in FIG. 8, red pixel 22-R may include a diffusive quantum dot layer 122-R and green pixel 22-G may include a diffusive quantum dot layer 122-G. Diffusive quantum dot layer 122-R may include red quantum dots 88-R embedded in a host material 90-R (similar to as in FIGS. 5-7). Additionally, layer 122-R includes light scattering particles 124 (sometimes referred to as nanoparticles, diffusive nanoparticles, light scattering nanoparticles, scattering particles, etc.) embedded in the host material 90-R. Diffusive quantum dot layer 122-G may include green quantum dots 88-G embedded in a host material 90-G (similar to as in FIGS. 5-7). Additionally, layer 122-G includes light scattering particles 124 (sometimes referred to as nanoparticles, diffusive nanoparticles, light scattering nanoparticles, scattering particles, etc.) embedded in the host material 90-G. Diffusive layer 94 for blue pixel 22-B may also include light scattering particles in a host material. However, no quantum dots are included in diffusive layer 94 for blue pixel 22-B of FIG. 8.

In FIG. 8, each pixel includes a corresponding color filter. A red color filter 106-R is formed over diffusive quantum dot layer 122-R for red pixel 22-R. A green color filter 106-G is formed over diffusive quantum dot layer 122-G for green pixel 22-G. A blue color filter 106-B is formed over diffusive layer 94 for blue pixel 22-B. This example is merely illustrative and the color filters may be omitted over pixels of one or more colors if desired.

Figure 9:
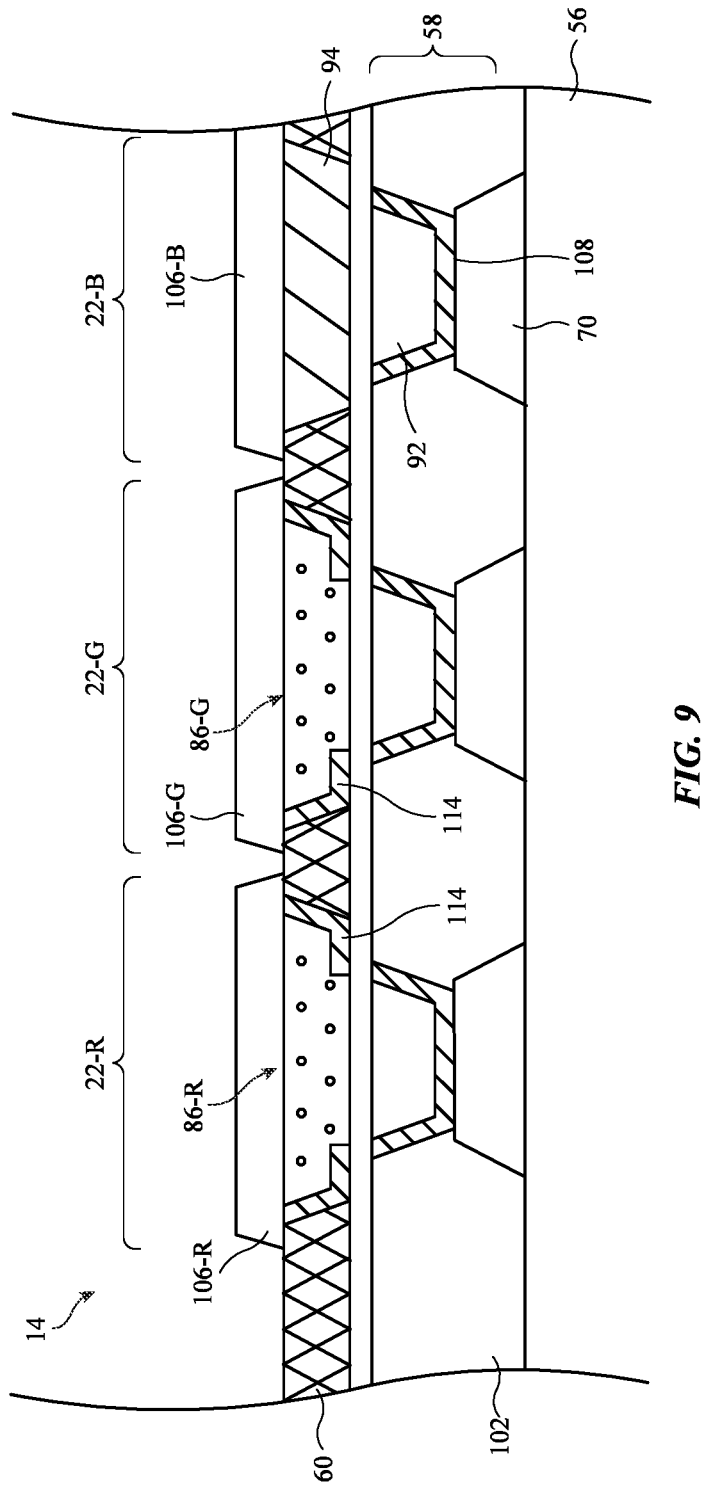
FIG. 9 is a cross-sectional side view of an illustrative display with quantum dot layers and a diffusive layer in respective trenches in an opaque layer in accordance with some embodiments.

In another possible arrangement, shown in FIG. 9, planarization layer 58 may be formed entirely from transparent layer 102. Quantum dot layer 86-R, quantum dot layer 86-G, and diffusive layer 94 are formed in trenches in opaque masking layer 60. Opaque masking layer 60 may have an opacity that is greater than 50%, greater than 70%, greater than 80%, greater than 85%, greater than 90%, greater than 95%, greater than 99%, etc. The arrangement in FIG. 9 is otherwise the same as in FIG. 6.

In FIG. 9, each pixel includes a corresponding color filter. A red color filter 106-R is formed over quantum dot layer 86-R for red pixel 22-R. A green color filter 106-G is formed over quantum dot layer 86-G for green pixel 22-G. A blue color filter 106-B is formed over diffusive layer 94 for blue pixel 22-B. This example is merely illustrative and the color filters may be omitted over pixels of one or more colors if desired.

Figure 10:
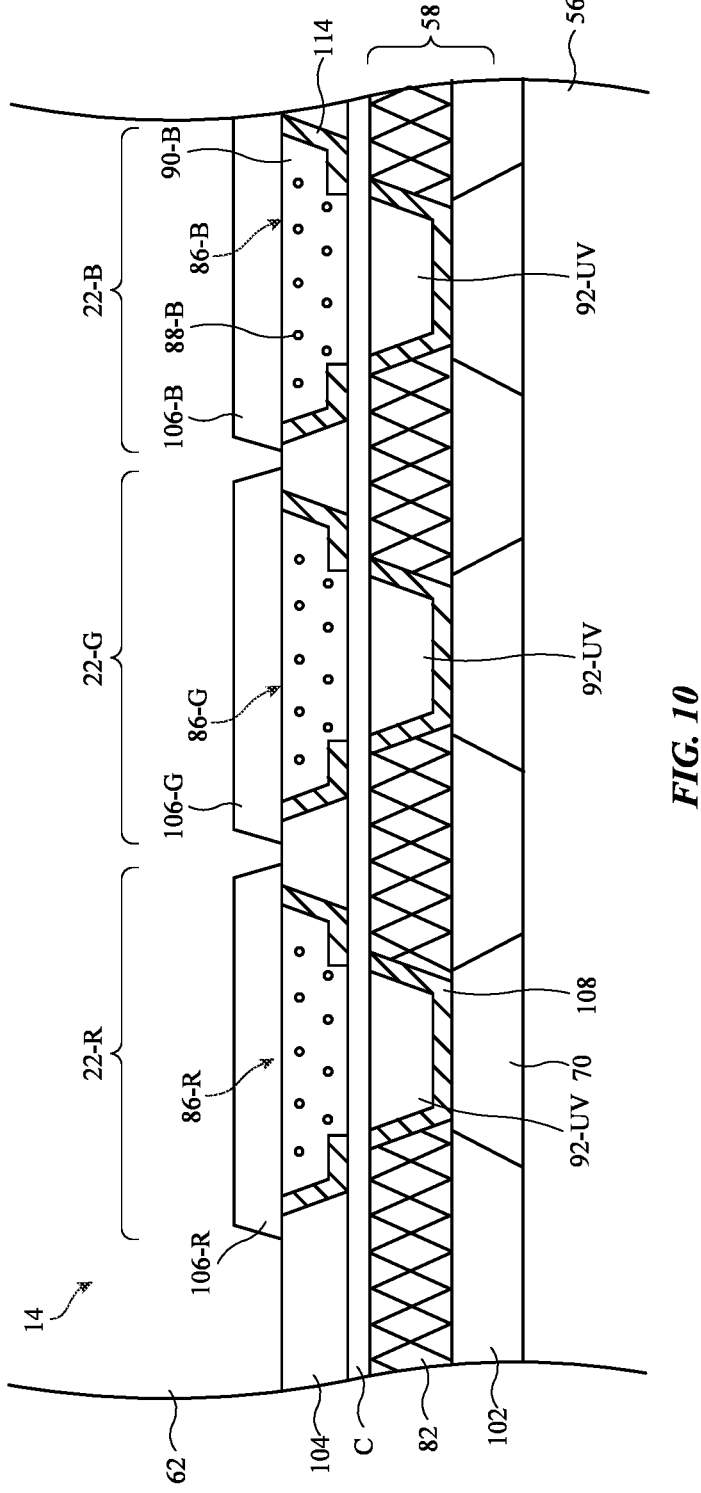
FIG. 10 is a cross-sectional side view of an illustrative display with quantum dot layers over ultraviolet light sources in accordance with some embodiments.

In the aforementioned examples, blue LEDs are used for the red, blue, and green pixels. This example is merely illustrative. In another possible embodiment, shown in FIG. 10, ultraviolet light-emitting diodes (that emit ultraviolet light) may be used for the red, blue, and green pixels. The arrangement in FIG. 10 is the same as in FIG. 6, except for the light sources are ultraviolet light-emitting diodes instead of blue light-emitting diodes. Additionally, in FIG. 6 only the red and green pixels include a reflector 114. In FIG. 10, blue pixel 22-B also includes a reflector 114 in the trench that contains a blue quantum dot layer 86-B.

Blue quantum dot layer 86-B includes blue quantum dots 88-B in a host material 90-B. The blue quantum dots 88-B convert ultraviolet light to blue light. The red and green quantum dots in FIG. 10 respectively convert red and green light to ultraviolet light.

In FIG. 10, each pixel includes a corresponding color filter. A red color filter 106-R is formed over quantum dot layer 86-R for red pixel 22-R. A green color filter 106-G is formed over quantum dot layer 86-G for green pixel 22-G. A blue color filter 106-B is formed over quantum dot layer 86-B for blue pixel 22-B. This example is merely illustrative and the color filters may be omitted over pixels of one or more colors if desired.

In FIGS. 6-10, the sidewall portions of reflector 108 are adjacent to (and conform to) the sides of LED 92. This example is merely illustrative. In another possible arrangement, shown in FIGS. 11-13, there may be intervening material between the sidewall portions of reflector 108 and the sides of LED 92.

As shown in the side view of FIG. 11, reflector 108 includes a bottom portion 112 and a sidewall portion 110 (similar to as described in connection with FIG. 6). However, in FIG. 11 the bottom portion 112 extends past the edges of LED 92 and spacer 70 along the X-direction. In other words, there is a gap along the X-direction between a right-most edge of LED 92 and a right-most edge of reflector 108 and there is a gap along the X-direction between a right-most edge of spacer 70 and a right-most edge of reflector 108. There is therefore a gap 126 between the edge of LED 92 and sidewall portion 110 of reflector 108.

Figure 11:
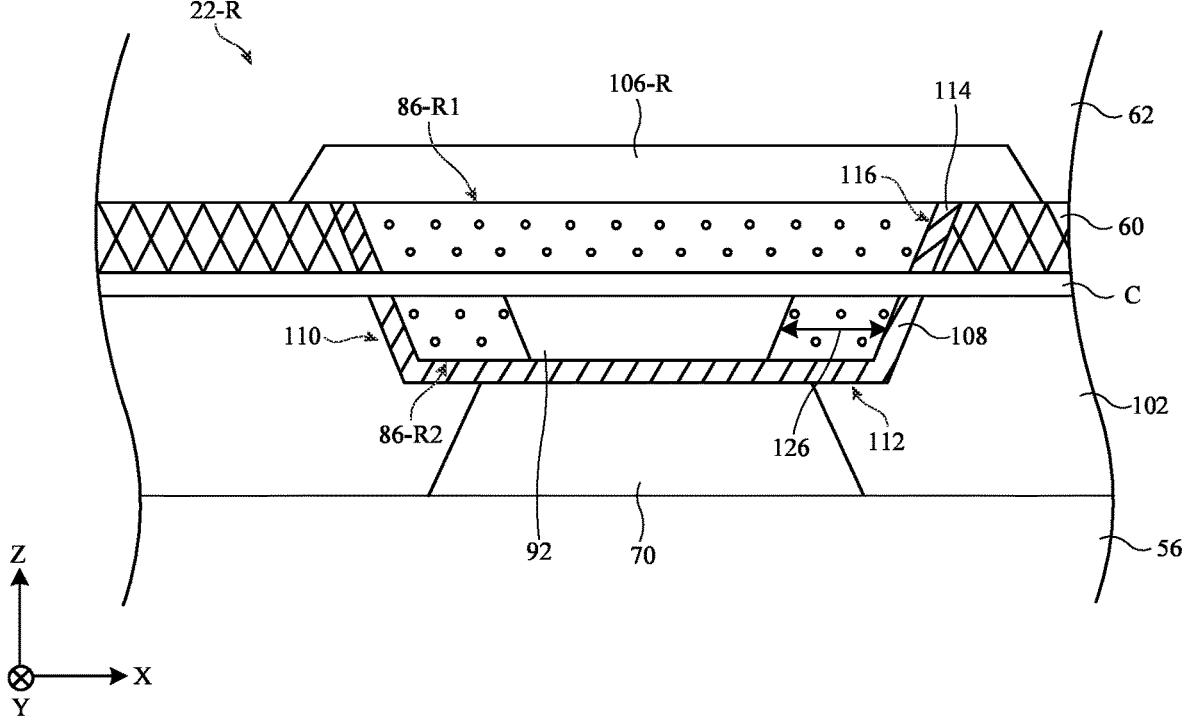
FIG. 11 is a cross-sectional side view of an illustrative display pixel with a reflector separated from the sides of a light-emitting diode by a gap and a quantum dot layer that fills the gap in accordance with some embodiments.

In the display pixel of FIG. 11, red quantum dots may be formed in the gap 126 between LED 92 and reflector 108. As shown, a first red quantum dot layer 86-R1 is formed in a trench in opaque masking layer 60 (above cathode C) and a second red quantum dot layer 86-R2 is formed in gap 126 between LED 92 and reflector 108. The first and second quantum dot layers may be formed from the same materials or may be formed from different materials.

Reflector 114 in FIG. 11 is similar to as described in connection with FIG. 6, except for bottom portion 118 is omitted. Sidewall portion 116 of reflector 114 may overlap and be aligned with sidewall portion 110 of reflector 108.

In FIG. 11, pixel 22-R includes a corresponding color filter. A red color filter 106-R is formed over quantum dot layer 86-R1 for red pixel 22-R. This example is merely illustrative and the color filter may be omitted if desired.

It is further noted that the arrangement of FIG. 11 may be used for a pixel of any desired color (e.g., a green pixel with a green quantum dot layer, a blue pixel with a blue quantum dot layer, etc.).

Figure 12:
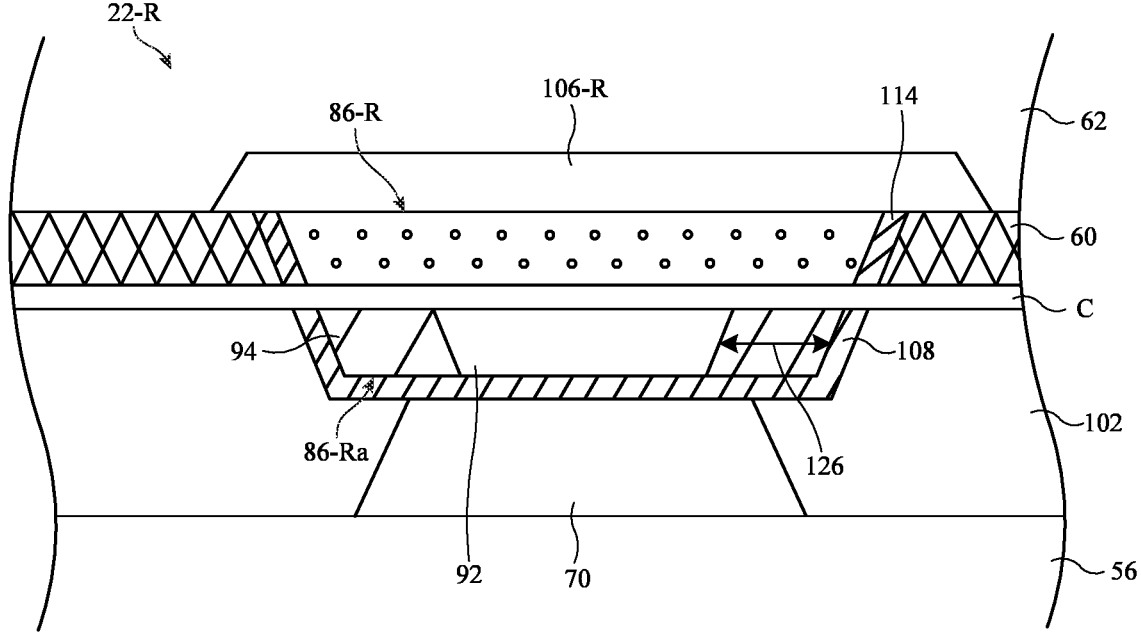
FIG. 12 is a cross-sectional side view of an illustrative display pixel with a reflector separated from the sides of a light-emitting diode by a gap and a diffusive layer that fills the gap in accordance with some embodiments.

In an alternate arrangement, shown in FIG. 12, diffusive layer 94 fills the gap 126 between LED 92 and reflector 108 instead of a quantum dot layer. Therefore, in FIG. 12, only one quantum dot layer 86-R is included.

In FIG. 12, pixel 22-R includes a corresponding color filter. A red color filter 106-R is formed over quantum dot layer 86-R for red pixel 22-R. This example is merely illustrative and the color filter may be omitted if desired.

It is further noted that the arrangement of FIG. 12 may be used for a pixel of any desired color (e.g., a green pixel with a green quantum dot layer, a blue pixel with a blue quantum dot layer, etc.).

In FIGS. 11 and 12, the trench in opaque masking layer 60 is filled only with a quantum dot layer. It is noted that this trench may instead be filled with both a quantum dot layer and a diffusive layer (as in FIGS. 5 and 7, for example).

Figure 13:
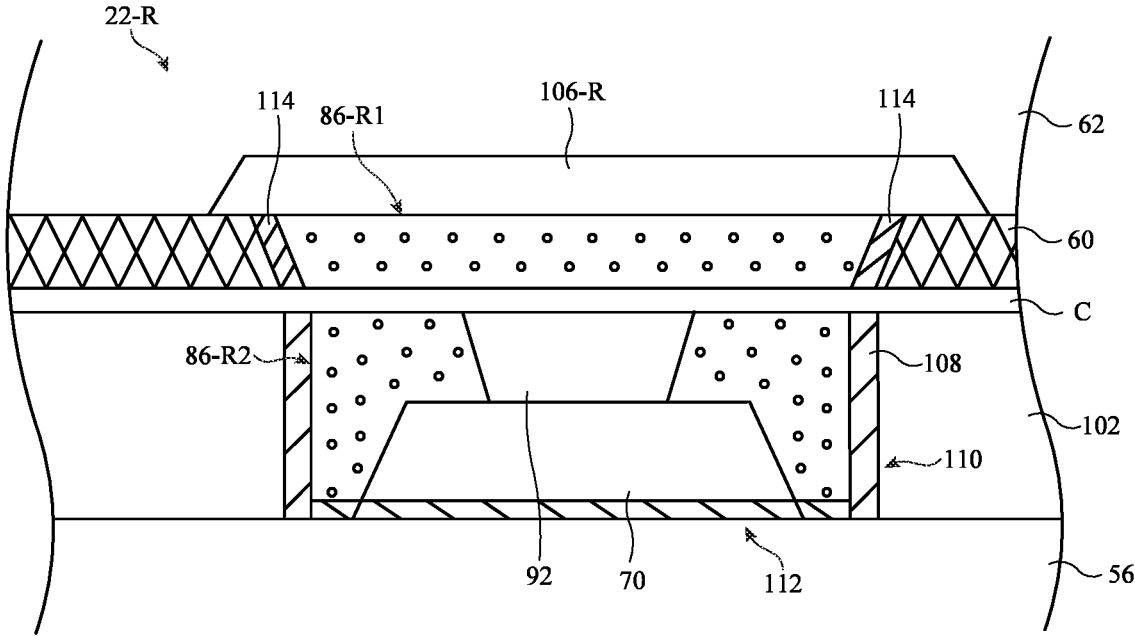
FIG. 13 is a cross-sectional side view of an illustrative display pixel with a reflector having a bottom portion positioned below a spacer in accordance with some embodiments.

In FIGS. 11 and 12, the bottom portion 112 of reflector 108 is interposed between spacer 70 and LED 92. This example is merely illustrative. In another possible arrangement, shown in FIG. 13, the bottom portion 112 of reflector 108 is interposed between spacer 70 and insulation layer 56. In FIG. 13, similar to FIG. 11, a first quantum dot layer 86-R1 is formed in the trench in opaque masking layer 60 and a second quantum dot layer 86-R2 is formed in the gap between the LED 92 and spacer 70 and the sidewall portion 110 of reflector 108.

In FIG. 13, pixel 22-R includes a corresponding color filter. A red color filter 106-R is formed over quantum dot layer 86-R1 for red pixel 22-R. This example is merely illustrative and the color filter may be omitted if desired.

It is further noted that the arrangement of FIG. 13 may be used for a pixel of any desired color (e.g., a green pixel with a green quantum dot layer, a blue pixel with a blue quantum dot layer, etc.).

The example of a quantum dot layer filling the gap between the LED 92 and spacer 70 and the sidewall portion 110 of reflector 108 in FIG. 13 is merely illustrative. This gap may instead be filled with a diffusive layer (as in FIG. 12).

Additionally, in FIG. 13, the trench in opaque masking layer 60 is filled only with a quantum dot layer. It is noted that this trench may instead be filled with both a quantum dot layer and a diffusive layer (as in FIGS. 5 and 7, for example).

The structures depicted herein may be used across the entire display (e.g., all of the blue pixels may have the same arrangement, all of the green pixels may have the same arrangement, and all of the green pixels may have the same arrangement). Alternatively, pixels of the same color may have different arrangements if desired.

The foregoing is merely illustrative and various modifications can be made to the described embodiments. The foregoing embodiments may be implemented individually or in any combination.

What is claimed is:

1. An electronic device comprising an array of pixels, wherein the array of pixels comprises:
   a first pixel, wherein the first pixel comprises:
      a first inorganic light-emitting diode of a first color;
   a second pixel, wherein the second pixel comprises:
      a second inorganic light-emitting diode of the first color;
      a first quantum dot layer that is formed over the second inorganic light-emitting diode, wherein the first quantum dot layer converts light from the first color to a second color; and
      a first reflective layer that is adjacent to the first quantum dot layer; and
   a third pixel, wherein the third pixel comprises:
      a third inorganic light-emitting diode of the first color;
      a second quantum dot layer that is formed over the third inorganic light-emitting diode, wherein the second quantum dot layer converts light from the first color to a third color; and
      a second reflective layer that is adjacent to the second quantum dot layer.

2. The electronic device defined in claim 1, wherein the first color is blue, wherein the second color is red, and wherein the third color is green.

3. The electronic device defined in claim 1, wherein the first color is ultraviolet, wherein the second color is red, and wherein the third color is green.

4. The electronic device defined in claim 3, wherein the first pixel further comprises:
   a third quantum dot layer that is formed over the first inorganic light-emitting diode, wherein the third quantum dot layer converts light from the first color to blue.

5. The electronic device defined in claim 4, wherein the first pixel further comprises a third reflective layer that is adjacent to the third quantum dot layer.

6. The electronic device defined in claim 1, wherein the first reflective layer has a first portion and a second portion that is at a non-zero, non-orthogonal angle relative to the first portion.

7. The electronic device defined in claim 1, wherein the second pixel further comprises:
   a third reflective layer that is formed around the second inorganic light-emitting diode.

8. The electronic device defined in claim 7, wherein the third reflective layer has a bottom portion that is adjacent to a bottom of the second inorganic light-emitting diode and a sidewall portion that is adjacent to sides of the second inorganic light-emitting diode.

9. The electronic device defined in claim 7, wherein the third reflective layer is separated from sides of the second inorganic light-emitting diode by a gap.

10. The electronic device defined in claim 9, wherein the second pixel further comprises:
   a third quantum dot layer in the gap, wherein the third quantum dot layer converts light from the first color to the second color.

11. The electronic device defined in claim 9, wherein the second pixel further comprises:
   a diffusive layer in the gap.

12. The electronic device defined in claim 9, wherein the second inorganic light-emitting diode is positioned on a spacer and wherein the third reflective layer has a bottom portion that is interposed between the second inorganic light-emitting diode and the spacer.

13. The electronic device defined in claim 9, wherein the second inorganic light-emitting diode is positioned on a spacer and wherein the spacer is interposed between the second inorganic light-emitting diode and a bottom portion of the third reflective layer.

14. The electronic device defined in claim 1, wherein the first pixel further comprises a first diffusive layer that is formed over the first inorganic light-emitting diode.

15. The electronic device defined in claim 14, wherein the second pixel further comprises a second diffusive layer that is formed over the second inorganic light-emitting diode and wherein the third pixel further comprises a third diffusive layer that is formed over the third inorganic light-emitting diode.

16. The electronic device defined in claim 14, wherein the first quantum dot layer comprises quantum dots and scattering particles in a host material.

17. The electronic device defined in claim 1, wherein the first quantum dot layer and the second quantum dot layer are formed in first and second respective trenches in a layer having a transparency that is greater than 80%.

18. The electronic device defined in claim 1, wherein the first quantum dot layer and the second quantum dot layer are formed in first and second respective trenches in a layer having a transparency that is less than 20%.

19. An electronic device comprising a pixel, wherein the pixel comprises:

an inorganic light-emitting diode that emits light of a first color;

a quantum dot layer that is formed over the inorganic light-emitting diode, wherein the quantum dot layer converts light from the first color to a second color;

an electrode that is interposed between the inorganic light-emitting diode and the quantum dot layer;

a first reflective layer with sidewall portions that are adjacent to the quantum dot layer; and a second reflective layer with sidewall portions that are adjacent to the inorganic light-emitting diode.

20. An electronic device comprising an array of pixels, wherein the array of pixels comprises:

a blue pixel, wherein the blue pixel comprises:

a first blue inorganic light-emitting diode; and a diffusive layer formed in a first trench in a layer of material, wherein the diffusive layer overlaps the first blue inorganic light-emitting diode and wherein no reflective layer is formed in the first trench;

a red pixel, wherein the red pixel comprises:

a second blue inorganic light-emitting diode;

a first quantum dot layer that is formed in a second trench in the layer of material, wherein the first quantum dot layer overlaps the second blue inorganic light-emitting diode and wherein the first quantum dot layer converts blue light to red light; and a first reflective layer in the second trench that is adjacent to the first quantum dot layer; and a green pixel, wherein the green pixel comprises:

a third blue inorganic light-emitting diode;

a second quantum dot layer that is formed in a third trench in the layer of material, wherein the second quantum dot layer overlaps the third blue inorganic light-emitting diode and wherein the second quantum dot layer converts blue light to green light; and a second reflective layer in the third trench that is adjacent to the second quantum dot layer.

* * * * *